(12) United States Patent
Kim et al.

(10) Patent No.: US 7,503,257 B2
(45) Date of Patent: Mar. 17, 2009

(54) PRINTING APPARATUS FOR LIQUID CRYSTAL DISPLAY DEVICE AND PATTERN FORMING METHOD USING THE SAME

(75) Inventors: Chul Ho Kim, Incheon-si (KR); Tae Young Oh, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 327 days.

(21) Appl. No.: 11/477,427

(22) Filed: Jun. 30, 2006

(65) Prior Publication Data

US 2007/0157829 A1    Jul. 12, 2007

(30) Foreign Application Priority Data

Dec. 29, 2005    (KR) .................. 10-2005-0133937

(51) Int. Cl.
B41F 17/00        (2006.01)

(52) U.S. Cl. .................. 101/216; 101/41; 101/217

(58) Field of Classification Search .................. 101/39, 101/41, 42, 55, 56, 81, 82, 150, 160, 161, 101/328, 329, 330, 337, 348
See application file for complete search history.

(56) References Cited

U.S. PATENT DOCUMENTS

| | | | | |
|---|---|---|---|---|
| 4,479,432 A | * | 10/1984 | Masaki et al. | 101/170 |
| 6,676,242 B2 | * | 1/2004 | Yun | 347/28 |
| 2002/0073866 A1 | * | 6/2002 | Bechtler et al. | 101/483 |
| 2004/0103803 A1 | * | 6/2004 | Price et al. | 101/350.5 |
| 2006/0210720 A1 | * | 9/2006 | Yoo | 427/428.01 |
| 2007/0009835 A1 | * | 1/2007 | Yoo et al. | 430/311 |
| 2007/0119322 A1 | * | 5/2007 | Chung et al. | 101/425 |
| 2007/0119324 A1 | * | 5/2007 | Yoo et al. | 101/492 |

FOREIGN PATENT DOCUMENTS

| | | |
|---|---|---|
| DE | 10 2004 005 576 A1 | 9/2004 |
| EP | 0 147 199 A2 | 7/1985 |
| EP | 1 602 483 A1 | 12/2004 |
| JP | 11-198337 | 7/1999 |
| JP | 2000-289320 | 10/2000 |
| JP | 2007160676 A * | 6/2007 |

* cited by examiner

*Primary Examiner*—Daniel J Colilla
*Assistant Examiner*—David Banh
(74) *Attorney, Agent, or Firm*—McKenna Long & Aldridge LLP

(57) ABSTRACT

A printing apparatus for a liquid crystal display (LCD) device and a patterning method using the same is disclosed. The printing apparatus includes a printing plate; a printing roller to roll on the printing plate and to print a pattern material onto a substrate; a coating roller to transfer the pattern material to the printing roller; and a printing nozzle to coat the pattern material onto the coating roller.

6 Claims, 7 Drawing Sheets

PRINTING APPARATUS FOR LIQUID CRYSTAL DISPLAY DEVICE AND PATTERN FORMING METHOD USING THE SAME

This application claims the benefit of the Korean Patent Application No. P2005-133937, filed on Dec. 29, 2005, which is hereby incorporated by reference for all purposes as if fully set forth herein.

BACKGROUND OF THE INVENTION

1. Field of the Invention

The present invention relates to a liquid crystal display (LCD) device, and more particularly, to a printing apparatus for a liquid crystal display (LCD) device and a patterning method using the same.

2. Discussion of the Related Art

Among various ultra-thin flat type display devices, which include a display screen having a thickness of no more than several centimeters, liquid crystal display (LCD) devices are widely used for notebook computers, monitors, aircraft, etc. because they have advantages such as low power consumption and portability.

An LCD device includes lower and upper substrates facing each other with a predetermined interval therebetween and a liquid crystal layer formed between the lower and upper substrates.

The lower substrate includes a gate line, a data line, and a thin film transistor. The gate line is formed perpendicular to the data line to define a unit pixel region. The thin film transistor is formed adjacent to a crossing of the gate and data lines and serves as a switching device. In addition, a pixel electrode is connected to the thin film transistor.

The upper substrate includes a black matrix layer for shielding the gate line, the data line and the thin film transistor from light, a color filter layer formed on the black matrix layer, and a common electrode formed on the color filter layer.

The above LCD device includes various elements formed by repeated steps. Photolithography may be used to form the elements in various shapes.

A patterning method using a photolithographic process of the related art will be described with reference to the accompanying drawings.

FIGS. 1A to 1C are cross sectional views illustrating a patterning process of the related art using photolithography.

As shown in FIG. 1A, a pattern material layer 20 is formed on a substrate 10, and a photoresist layer 21 is formed on the pattern material layer 20.

As shown in FIG. 1B, a mask 25 with a predetermined pattern is positioned above the photoresist layer 21, and then light is provided to the substrate 10 by an exposure apparatus.

As shown in FIG. 1C, the photoresist layer 21 is patterned by a development process. The pattern material layer 20 is etched using the patterned photoresist layer 21 as a mask to obtain a desired pattern 20a.

The above photolithographic process uses the photoresist layer and the mask having a predetermined pattern that increases the manufacturing cost. In addition, photolithography requires exposure and development, which are complicated processes that increase manufacturing time.

To overcome these problems associated with photolithography, new patterning methods have been developed, such as a printing method using a printing roller.

A patterning method using a printing roller according to the related art will be described with reference to the FIGS. 2A to 2D.

FIGS. 2A to 2D are cross sectional views illustrating a process for forming a pattern material layer on a substrate using a printing roller according to the related art.

As shown in FIG. 2A, a printing roller 30 having a blanket 32 adhered thereonto is prepared. Then, a pattern material 20 is coated on a surface of the printing roller 30 by a printing nozzle 40.

As shown in FIG. 2B, the printing roller 30 having the blanket 32 adhered thereonto rolls on a printing plate 50 having a plurality of projections 55. Accordingly, some pattern material 20b is printed on the projections 55 of the printing plate 50, while other pattern material 20a remains on the printing roller 30. That is, a predetermined pattern of the pattern material is formed of pattern material 20a remaining on the printing roller 30.

The blanket 32 adhered to the surface of the printing roller 30 is formed of a resin material having a predetermined elasticity. The elasticity of the blanket 32 decreases friction between the printing roller 30 and the printing plate 50 when printing the pattern material 20 of the printing roller 30 onto the printing plate 50.

As shown in FIG. 2C, as the printing roller 30 having the pattern material of the predetermined pattern rolls on a substrate 10, the pattern material 20a is printed onto the substrate 10.

The patterning method using the printing roller and the printing plate does not use a mask having the predetermined pattern and does not use exposure and development processes, thereby decreasing the manufacturing cost and time.

However, the patterning method using the printing roller according to the related art has the following disadvantages.

In the patterning method using the printing roller according to the related art, the pattern material is directly coated on the printing roller having the blanket by the printing nozzle. Solvent included in the pattern material may be absorbed into the blanket causing the blanket to deform or swell.

SUMMARY OF THE INVENTION

Accordingly, the present invention is directed to a printing apparatus for a liquid crystal display (LCD) device and a patterning method using the same that substantially obviates one or more of the problems due to limitations and disadvantages of the related art.

An advantage of the present invention is to provide a printing apparatus for a liquid crystal display (LCD) device and a patterning method using the same, to minimize a deformation of a blanket adhered to a surface of a printing roller.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a printing apparatus includes: a printing plate; a printing roller to roll on the printing plate and to print a pattern material onto a substrate; a coating roller to transfer the pattern material to the printing roller; and a printing nozzle to coat the pattern material onto the coating roller.

In another aspect of the present invention, a patterning method includes: coating a pattern material on a coating roller through a printing nozzle; transferring pattern material from the coating roller onto a printing roller; rolling the printing roller on a printing plate having a plurality of projections to print some of the pattern material onto the projections of the printing roller to leave pattern material of a predetermined pattern remaining on the printing roller; and rolling the printing roller having the pattern material of the predetermined pattern coated thereonto on a substrate to print pattern material of the predetermined pattern onto the substrate.

In another aspect of the present invention, a method for manufacturing an LCD device includes: preparing a first substrate and a second substrate; forming a pattern on the first substrate; and forming a liquid crystal layer between the first and the second substrates; wherein forming a pattern on the first substrate includes: coating a pattern material onto a coating roller through a printing nozzle; transferring the pattern material on the coating roller onto a printing roller; rolling the printing roller on a printing plate having a plurality of projections to print some of the pattern material onto the projections of the printing roller to leave pattern material of a predetermined pattern remaining on the printing roller; and rolling the printing roller having the pattern material of the predetermined pattern coated thereonto on the first substrate to print pattern material of the predetermined pattern onto the first substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the embodiments of the present invention, examples of which are illustrated in the accompanying drawings. Wherever possible, the same reference numbers will be used throughout the drawings to refer to the same or like parts.

Hereinafter, a printing apparatus and a method for manufacturing a liquid crystal display (LCD) device using the same according to the present invention will be described with reference to the accompanying drawings.

Figure 1A:
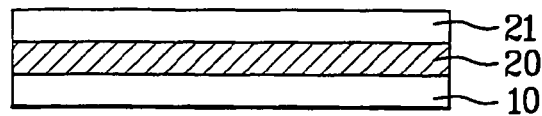
FIGS. 1A, 1B, and 1C are cross sectional views illustrating a photolithography of the related art.
Figure 1B:
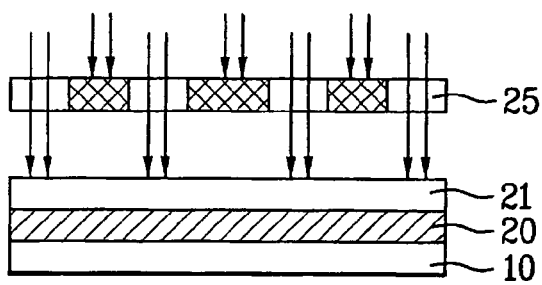
Figure 1C:
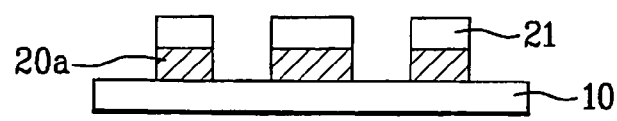
Figure 2A:
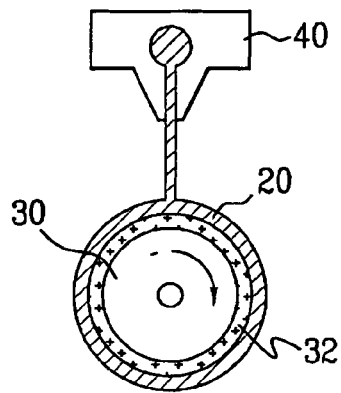
FIGS. 2A, 2B, and 2C are cross sectional views illustrating a patterning process using a printing roller and a printing plate according to the related art.
Figure 2B:
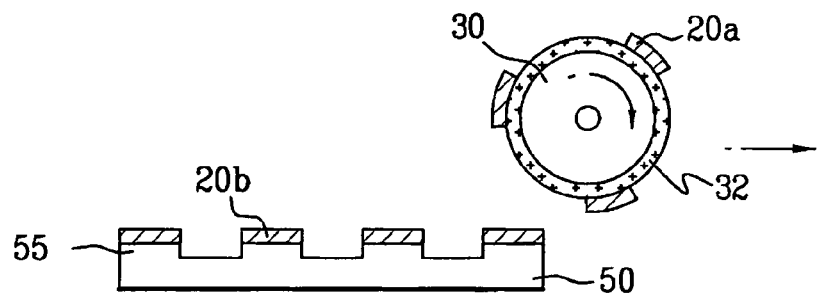
Figure 2C:
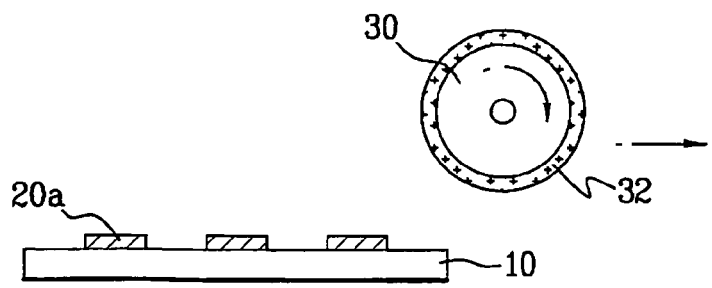
Figure 3:
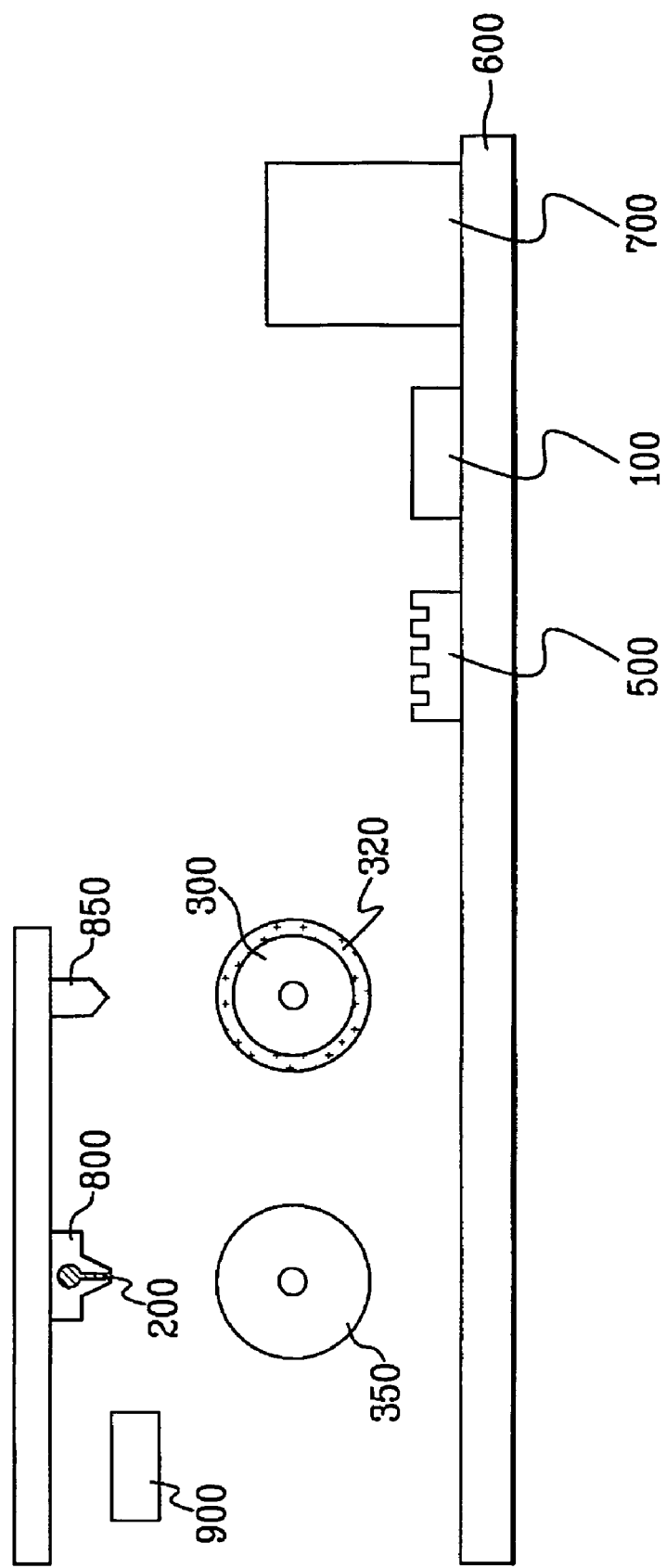
FIG. 3 is a cross sectional view illustrating a printing apparatus according to the present invention.

FIG. 3 is a cross sectional view illustrating a printing apparatus according to an embodiment of the present invention.

As shown in FIG. 3, the printing apparatus according to the present invention is provided with a rail 600, a printing plate 500, a substrate 100, a printing roller 300, a coating roller 350, and a printing nozzle 800. The printing plate 500 and the substrate 100 are positioned on, and moved along the rail 600. The printing roller 300 prints a predetermined pattern on the substrate 100 through use of the printing plate 500 on the rail 600. The coating roller 350 prints a pattern material 200 on the printing roller 300. The pattern material 200 is supplied through the printing nozzle 800, and is coated on the coating roller 350.

While a rail is depicted in FIG. 3, other conveyers such as a track, conveyer belt system, or roller systems may be used to move components relative to each other.

Furthermore, a blanket 320 is adhered onto the surface of the printing roller 300, wherein the blanket 320 is formed of Si-based resin. Accordingly, the blanket 320 of Si-based resin has elasticity to decrease friction between the printing roller 300 and the printing plate 500 and between the printing roller 300 and the substrate 100 when the pattern material is printed on the printing plate 500 or on the substrate 100 by the printing roller 300.

In the embodiment of the present invention illustrated in FIG. 3, the pattern material 200 is coated on the coating roller 350 having no blanket. Upon coating the pattern material 200 onto the surface of the coating roller 350, the solvent is vaporized. Even though the pattern material 200 of the coating roller 350 is printed onto the printing roller 300, deformation and swelling of the blanket 320 of the printing roller 300 are avoided because the solvent is vaporized from the pattern material.

While the pattern material 200 is being printed on the printing roller 300 by the coating roller 350, a pressure may be applied to the printing roller 300 by the coating roller 350, thereby improving uniformity in layer formed by the pattern material 200.

As further illustrated in FIG. 3, the printing apparatus further includes a cleaning nozzle 850, a cleaning unit 700, and a slit nozzle bath 900.

The cleaning nozzle 850 is provided to remove the pattern material 200 remaining on the coating roller 350 after the printing roller 300 prints the pattern material 200 transferred from the coating roller 350. The cleaning nozzle 850 cleans the coating roller 350 with the mutual interaction of pressure and chemical process by discharging a quick-drying material such as thinner or acetone.

The cleaning unit 700 cleans the printing plate 500. That is, the cleaning unit 700 removes the pattern material from the printing plate 500.

The cleaning unit 700 is positioned on the rail 600. For cleaning of the printing plate 500, the cleaning unit 700 is moved to and positioned above the printing plate 500. In addition, the cleaning unit 700 includes a drying part, for example, a spraying part or an air knife, for performing the cleaning and drying process.

The slit nozzle bath 900 is provided to prevent the pattern material 200 provided inside the printing nozzle 800 from becoming hardened within the printing nozzle 800 and to clean material from the printing nozzle 800.

Figure 6:
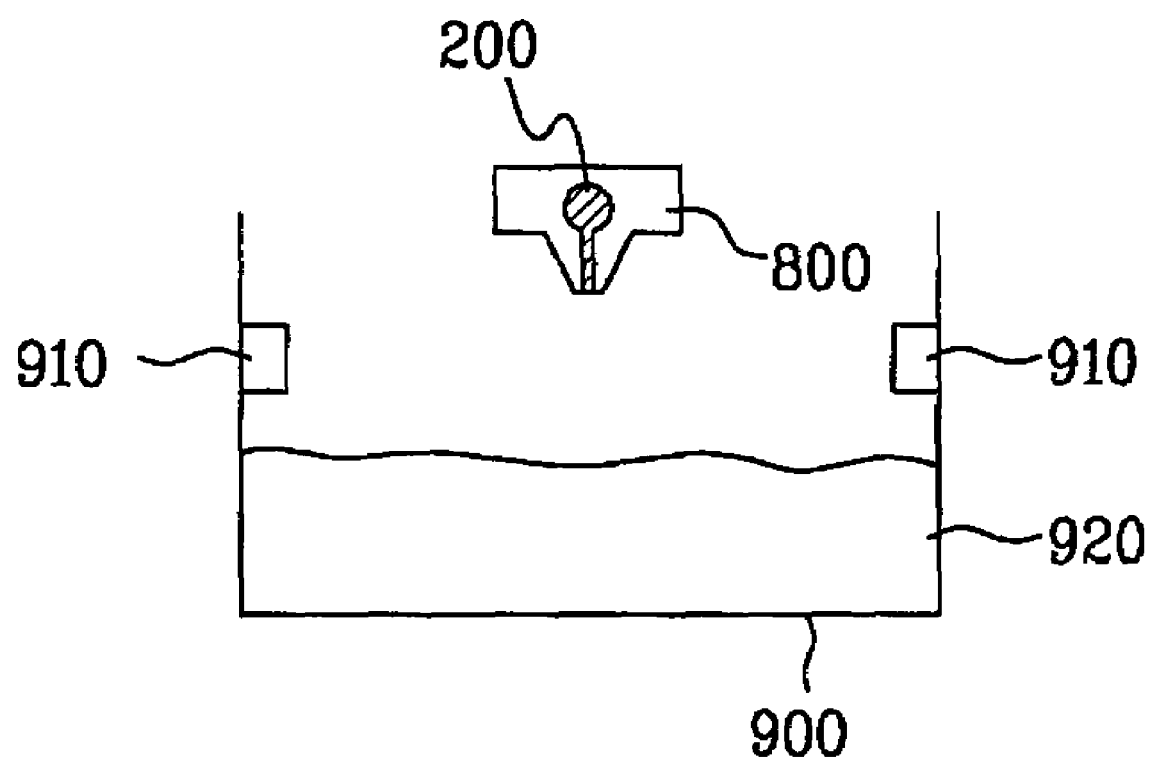
FIG. 6 is a schematic view illustrating a nozzle bath and spray elements according to an embodiment of the present invention.

As shown in FIG. 6, the cleaning bath includes one or more spray elements 910 for spraying liquid onto the nozzle to more printing material 200 or other matter from the nozzle.

The printing nozzle 800 has the pattern material 200 provided therein. During the printing process, the solvent included in the pattern material 200 is vaporized and the pattern material 200 can harden inside the printing nozzle 800.

For preventing material from hardening within the printing nozzle 800, the slit nozzle bath 900 includes a cleaning solvent 920 capable of dissolving or softening the printing material 200. For example, the cleaning solvent 920 may be an organic material, such as thinner or acetone to prevent the pattern material 200 provided in the printing nozzle 800 from hardening. Vapors of the cleaning solvent 920 dissolve printing material 200 in the printing nozzle 800 to keep the opening of the printing nozzle 800 clear.

A patterning method using the printing apparatus according to the present invention will be described as follows.

FIGS. 4A to 4D are cross sectional views illustrating a patterning method using the printing apparatus according to the present invention.

Figure 4A:
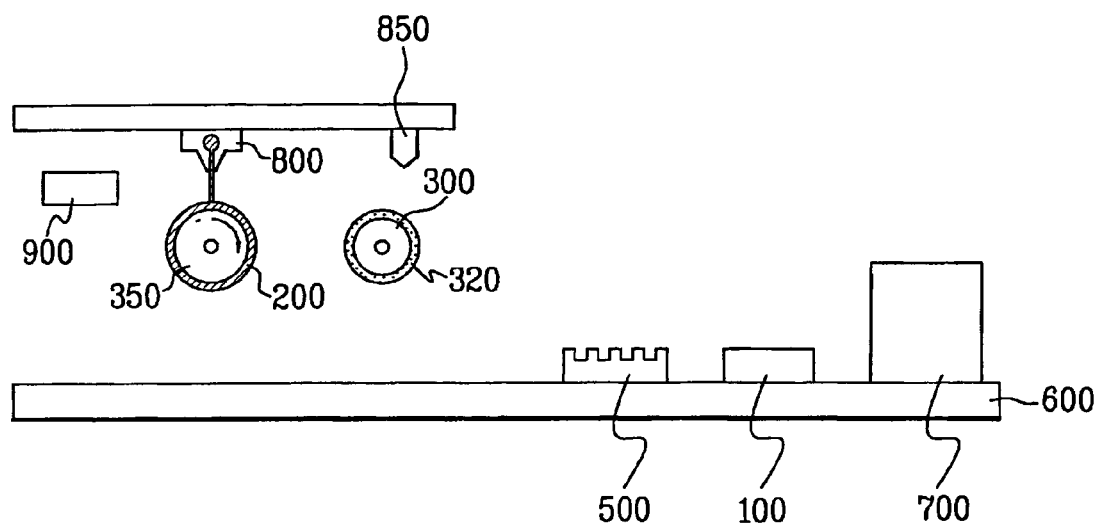
FIGS. 4A, 4B, 4C, and 4D are cross sectional views illustrating a patterning method using a printing apparatus according to the present invention.

As shown in FIG. 4A, the pattern material 200 is provided through the printing nozzle 800, and is coated onto the surface of the coating roller 350.

Figure 4B:
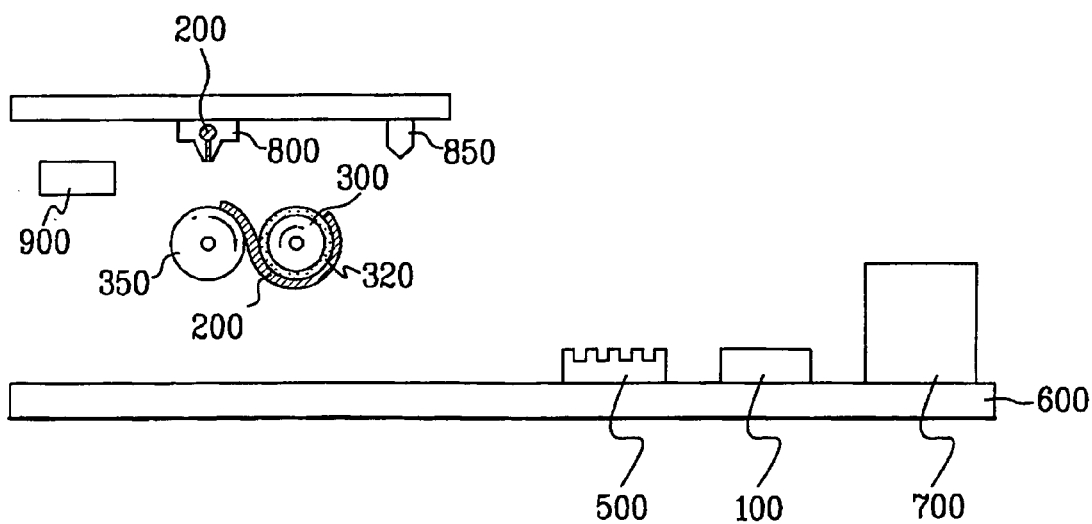

As shown in FIG. 4B, the pattern material 200 coated on the coating roller 350 is printed on the printing roller 300 to which the blanket 320 is adhered.

Once the pattern material 200 is coated on the coating roller 350, the solvent included in the pattern material 200 is vaporizes. Accordingly, the solvent is not transferred to the blanket 320 of the printing roller 300 and the blanket 320 of the printing roller 300 is not deformed or swelled by solvent.

In FIG. 4B, the printing roller 300 is illustrated as moving towards the coating roller 350 to print the pattern material onto the printing roller 300. Alternatively, the coating roller 350 may move towards the printing roller 300 to transfer the pattern material onto the printing roller 300.

When the pattern material 200 of the coating roller 350 is printed onto the printing roller 300, some of the coated pattern material 200 may be left on the coating roller 350. Printing all of the pattern material 200 from the coating roller 350 onto the printing roller 300, may result in forming a non-uniform layer of the pattern material 200 on the printing roller 300.

Figure 4C:
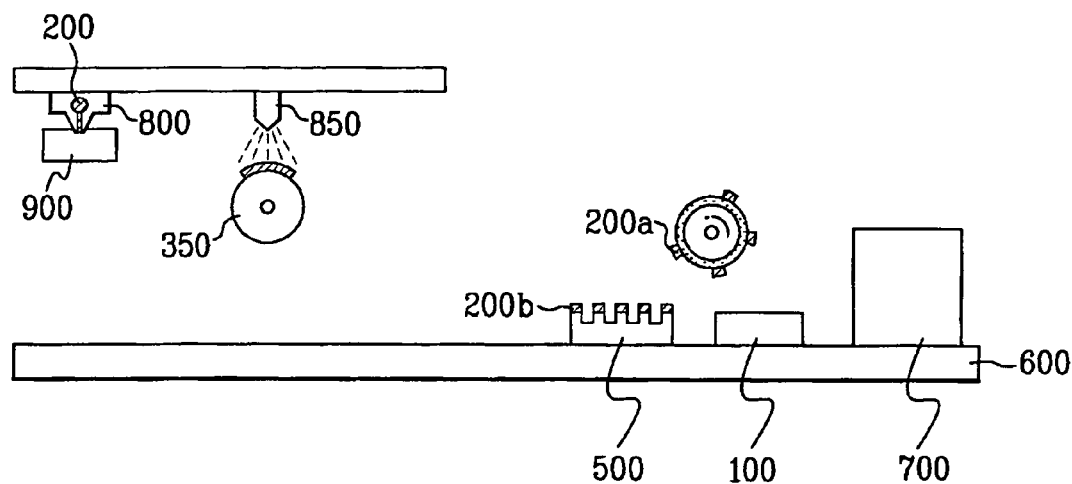

As shown in FIG. 4C, the printing roller 300 is rolled on the printing plate 500 having the projections, and some pattern material 200b is printed onto the projections of the printing plate 500, while the other pattern material 200a remains on the printing roller 300. The pattern material 200a remaining on the printing roller forms a predetermined pattern of pattern material on the printing roller 300.

The printing nozzle 800 is moved to the printing nozzle bath 900 to clean the nozzle to prevent the penetration of foreign materials into the nozzle and to prevent pattern material 200 from hardening within the opening of the printing nozzle 800. In addition, the cleaning nozzle 850 is moved to the coating roller 350 to remove the pattern material remaining on the coating roller 350.

Figure 4D:
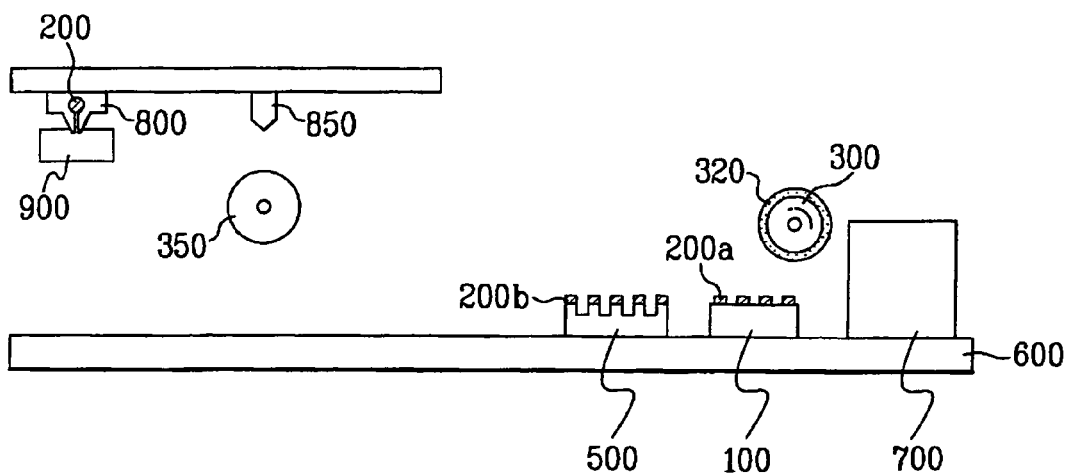

As shown in FIG. 4D, the printing roller 300 is rolled on the substrate 100, to print the pattern onto the substrate 100. The cleaning unit 700 moves to the printing plate 500 to clean the printing plate 500.

The above steps may be repetitively performed to form the pattern on LCD substrates.

A method for manufacturing an LCD device using the above patterning method according to the present invention will be described with reference to the accompanying drawings.

FIGS. 5A to 5D are cross sectional views illustrating a method for manufacturing an LCD device according to the present invention.

Figure 5A:
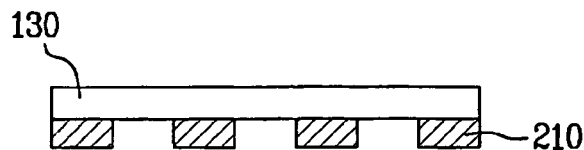
FIGS. 5A, 5B, 5C, and 5D are cross sectional views illustrating a method for manufacturing an LCD device according to the present invention.

As shown in FIG. 5A, a black matrix layer 210 is formed on a first substrate 130. That is, as shown in FIGS. 4A to 4D, a black matrix material 210 is supplied through the printing nozzle 800, and is coated onto the coating roller 350. The black matrix material 210 coated on the coating roller 350 is printed onto the printing roller 300 to which the blanket 320 is adhered. The printing roller 300 is rolled on the printing plate 500 having the plurality of projections. Some of the black matrix material is printed onto the projections of the printing plate 500, leaving black matrix material having a predetermined form remaining on the printing roller. The printing roller 300 is then rolled on the first substrate 130, and the black matrix layer 210 of the predetermined pattern is printed onto the first substrate 130.

Figure 5B:
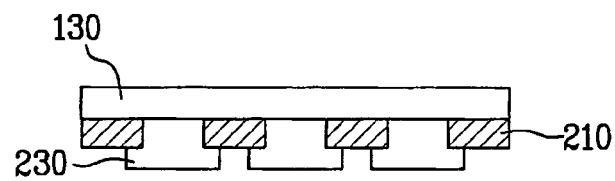

An RGB color filter material is coated on the coating roller 350. As shown in FIG. 5B, an RGB color filter layer 230 is formed between each pattern of the black matrix layer 210 on the first substrate 130.

Figure 5C:

Then, as shown in FIG. 5C, a second substrate 160 of a thin film transistor array substrate is prepared.

Although not shown, the second substrate 160 includes gate and data lines, a thin film transistor TFT, a passivation layer, and a pixel electrode. The gate and data lines are formed perpendicular to each other to define a pixel region. The thin film transistor TFT is formed adjacent to a crossing of the gate and data lines. A passivation layer is formed on an entire surface of the second substrate 160 including the thin film transistor TFT, and the pixel electrode is electrically connected to a drain electrode of the thin film transistor TFT.

Figure 5D:
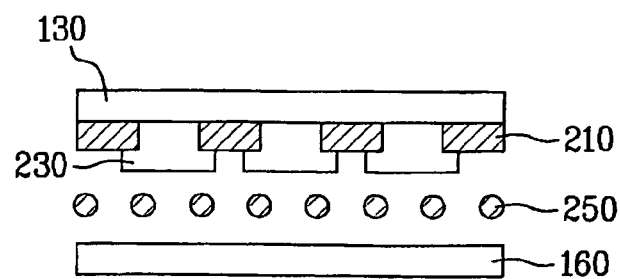

As shown in FIG. 5D, the first and second substrates 130 and 160 are bonded to each other, and a liquid crystal layer 250 is formed between the first and second substrates 130 and 160.

The liquid crystal layer 250 may be formed in a dispensing method or an injection method.

When using the dispensing method of liquid crystal, a sealant having no inlet is formed on any one of the first and second substrates 130 and 160, liquid crystal is dispensed on any one of the first and second substrates 130 and 160, and the two substrates are bonded to each other.

When using the injection method, after forming a sealant having an inlet on any one of the first and second substrates 130 and 160, and liquid crystal is injected into a space between the first and second substrates 130 and 160 by capillary phenomenon and pressure difference.

As mentioned above, the patterning method and the method for manufacturing the LCD device using the same according to embodiments of the present invention have the following advantages.

After the pattern material is coated onto the surface of the coating roller, the solvent included in the pattern material vaporizes. Accordingly, even though the pattern material is transferred onto the blanket adhered to the surface of the printing roller, there are no bad effects such as swelling or deformation caused by the solvent being absorbed by the blanket of the printing roller. As a result, it is possible to decrease the manufacturing cost owing to the increased replacement period of the blanket.

As compared with the case of directly coating the pattern material on the printing roller through the printing nozzle, using the coating roller to transfer the pattern to the printing roller may provide improved uniformity in layer of the pattern material.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A printing apparatus comprising:
    a printing plate;
    a printing roller having a blanket adhered to the surface thereof configured to roll on the printing plate;
    a coating roller to transfer a pattern material to the printing roller, wherein a material of the coating roller is substantially non-absorbent;
    a substrate, wherein the printing roller contacts the substrate;
    a printing nozzle to coat the pattern material onto the coating roller;
    a conveyer wherein the printing plate and the substrate are movable along the conveyer;
    a cleaning nozzle to clean the coating roller;
    a cleaning unit to clean the printing plate; and
    a printing nozzle bath to clean the printing nozzle,
    wherein one of the coating roller and the printing roller is movable towards the other of the coating roller and the printing roller;
    wherein the printing plate removes pattern material from the printing roller to form a pattern that is transferred onto the substrate.

2. The printing apparatus of claim 1, wherein the printing roller is movable towards the coating roller, and wherein the printing roller is movable towards the printing plate.

3. The printing apparatus of claim 1, wherein a material of the coating roller is one of metal, plastic, or glass.

4. The printing apparatus of claim 1, wherein the printing nozzle bath includes a spray element to clean the printing nozzle.

5. The printing apparatus of claim 1, the printing nozzle bath including a solvent to prevent the pattern material from hardening inside the printing nozzle.

6. The printing apparatus of claim 1, wherein the blanket is formed of Si-based resin.

* * * * *